(12) United States Patent
Gamliel

(10) Patent No.: US 8,264,283 B1
(45) Date of Patent: *Sep. 11, 2012

(54) SINGLE SIDE BAND MIXER

(75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 12/589,187

(22) Filed: Oct. 19, 2009

Related U.S. Application Data

(63) Continuation-in-part of application No. 11/731,211, filed on Mar. 29, 2007, now Pat. No. 7,616,063, and a continuation-in-part of application No. 12/322,740, filed on Feb. 6, 2009, now Pat. No. 8,040,194.

(51) Int. Cl.
*H03L 7/085* (2006.01)

(52) U.S. Cl. ............. 331/1 A; 331/16; 331/18; 455/203; 455/323

(58) Field of Classification Search ............... 331/1 A; 375/270, 277, 301, 321; 322/170; 455/47, 455/109, 203, 323
See application file for complete search history.

(56) References Cited

U.S. PATENT DOCUMENTS

| | | | |
|---|---|---|---|
| 3,913,037 A | 10/1975 | Himono et al. |
| 4,224,572 A | 9/1980 | Will |
| 4,979,233 A | 12/1990 | Kawahata |
| 5,006,811 A | 4/1991 | Kruger |
| 5,027,163 A | 6/1991 | Dobrovolny |
| 5,060,298 A | 10/1991 | Waugh et al. |
| 5,280,647 A | 1/1994 | Arai et al. |
| 5,280,648 A | 1/1994 | Dobrovolny |
| 5,361,409 A | 11/1994 | Vice |
| 5,513,390 A | 4/1996 | Vice |
| 5,534,830 A | 7/1996 | Ralph |
| 5,640,132 A | 6/1997 | Ralph |
| 5,640,699 A | 6/1997 | Ralph |
| 5,731,740 A | 3/1998 | van de Westerlo |
| 5,732,345 A | 3/1998 | Vice |
| 5,740,528 A | 4/1998 | Drennen |
| 5,774,801 A | 6/1998 | Li et al. |
| 5,799,248 A | 8/1998 | Vice |
| 5,854,974 A | 12/1998 | Li |
| 5,867,072 A | 2/1999 | Logothetis |
| 5,903,820 A | 5/1999 | Hagstrom |
| 5,987,315 A | 11/1999 | Nishida |
| 6,108,529 A | 8/2000 | Vice et al. |
| 6,140,892 A | 10/2000 | Uda et al. |
| 6,263,198 B1 | 7/2001 | Li |
| 6,275,687 B1 | 8/2001 | Lloyd |
| 6,278,872 B1 | 8/2001 | Poulin et al. |
| 6,317,590 B1 | 11/2001 | Nash et al. |
| 6,343,211 B1 | 1/2002 | Thodesen et al. |
| 6,348,830 B1 | 2/2002 | Rebeiz et al. |
| 6,427,069 B1 | 7/2002 | Galin |
| 6,438,563 B1 | 8/2002 | Kawagoe |

(Continued)

*Primary Examiner* — Joseph Chang
*Assistant Examiner* — Jeffrey Shin
(74) *Attorney, Agent, or Firm* — Siegmar Silber, Esq.

(57) ABSTRACT

A single side band mixer is composed of standard digital logic elements and field effect transistors, forming a pair of quadrature generators coupled with a mixer-splitter circuit. This design results in a single side band mixer with a bandwidth from DC to at least 100 MHz when realized with CMOS digital logic circuitry. This design allows the single side band mixer to bring particular improvement to circuits including frequency synthesizers, quadrature demodulators and up-converters.

14 Claims, 6 Drawing Sheets

U.S. PATENT DOCUMENTS

| | | | |
|---|---|---|---|
| 6,587,699 B2 | 7/2003 | Olsen et al. | |
| 6,611,696 B2 | 8/2003 | Chedester et al. | |
| 6,653,885 B2 | 11/2003 | Wu et al. | |
| 6,653,910 B2 | 11/2003 | Escalera et al. | |
| 6,665,546 B2 | 12/2003 | Slaughter et al. | |
| 6,714,800 B2 | 3/2004 | Johnson et al. | |
| 6,804,500 B2 | 10/2004 | Yamaguchi | |
| 6,917,796 B2 | 7/2005 | Setty et al. | |
| 6,937,456 B2 | 8/2005 | Pasternak | |
| 6,947,717 B2 | 9/2005 | Daxion | |
| 6,957,055 B2 | 10/2005 | Gamliel | |
| 6,959,180 B2 | 10/2005 | Ji | |
| 7,013,122 B2 | 3/2006 | Gamliel | |
| 7,027,795 B2 | 4/2006 | Ji | |
| 7,072,636 B2 | 7/2006 | Dobrovolny | |
| 7,305,217 B2 | 12/2007 | Kirkhart | |
| 7,324,796 B2 | 1/2008 | Ji | |
| 7,616,063 B1 * | 11/2009 | Gamliel | 331/1 A |
| 2004/0259519 A1 * | 12/2004 | Su | 455/326 |
| 2005/0088204 A1 * | 4/2005 | Behzad | 327/65 |
| 2009/0002065 A1 * | 1/2009 | Mirzaei et al. | 327/551 |

* cited by examiner

| freq | dBm(RFout) |
|---|---|
| 0.0000 Hz | -39.559 |
| 100.0 kHz | -321.047 |
| 200.0 kHz | -54.005 |
| 300.0 kHz | -320.627 |
| 99.70 MHz | -47.338 |
| 99.80 MHz | -318.445 |
| 99.90 MHz | -11.554 |
| 100.0 MHz | -331.011 |
| 100.1 MHz | -66.807 |
| 100.2 MHz | -317.527 |
| 100.3 MHz | -51.766 |
| 199.8 MHz | -53.076 |
| 199.9 MHz | -322.291 |
| 200.0 MHz | -42.062 |
| 200.1 MHz | -324.546 |
| 200.2 MHz | -47.312 |
| 299.9 MHz | -39.846 |
| 300.0 MHz | -328.794 |
| 300.1 MHz | -23.756 |

| freq | ConvLoss |
|---|---|
| 99.90 MHz | -7.554 |

Fig. 6

SINGLE SIDE BAND MIXER

CROSS REFERENCE TO RELATED APPLICATIONS

This is a continuation-in-part application claiming priority from application Ser. No. 11/731,211 entitled FREQUENCY SYNTHESIZER USING A PHASE-LOCKED LOOP AND SINGLE SIDE BAND MIXER, filed Mar. 29, 2007 now U.S. Pat. No. 7,616,063 and application Ser. No. 12/322,740 entitled FREQUENCY SYNTHESIZER USING A PHASE-LOCKED LOOP AND SINGLE SIDE BAND MIXER, filed Feb. 6, 2009 now U.S. Pat. No. 8,040,194.

TECHNICAL FIELD

The present invention relates generally to single side band mixers, particularly to single side band mixers implemented using digital logic elements and field effect transistors to provide circuits with improved frequency bandwidth from DC to radio frequencies.

BACKGROUND INFORMATION

Single side band (SSB) mixers are used in a wide range of electronic equipment, particularly in radio and other high frequency equipment where there is a need to mix frequencies in an additive or subtractive manner, or to compare phases of different signals. Some of the typical circuits employing SSB mixers include frequency synthesizers, quadrature demodulators and up-converters.

One example of a prior art SSB mixer is taught by U.S. Pat. No. 6,496,545 entitled SINGLE SIDE-BAND MIXER which achieves a high level of sideband rejection, but does so with significant circuit complexity and also requires fabrication in a BiCMOS integrated circuit process in order to achieve sufficient matching of components to control parameters such as phase angle error. The circuit complexity and BiCMOS process requirements both add undesirable cost to this SSB mixer.

The bandwidth limitations of prior art SSB mixers are demonstrated in a frequency synthesizer that provides a wide frequency range along with improved noise performance. U.S. Pat. No. 6,977,556 entitled RATIONAL FREQUENCY SYNTHESIZERS discloses the use of multiple SSB mixers for a range of frequency ratios based on the output frequency and the reference frequency. While this invention enables performance across a wide frequency range, the use of multiple SSB mixers, ratio dividers and associated control circuitry is a complex and potentially expensive approach to providing a wide frequency range with low noise.

SUMMARY

The SSB mixer circuit described herein provides a wide frequency bandwidth from DC to at least 100 MHz while maintaining circuit simplicity, low cost and low power consumption. This circuit is implemented with the standard digital logic elements known as inverters and T-type flip-flops, plus a mixer-splitter circuit composed of FETs and a load resistor. Both the inverters and T-type flip-flops are commonly manufactured in low-cost integrated circuit processes including CMOS. The SSB mixer has a local oscillator (LO) input, an intermediate frequency (IF) input and a radio frequency (RF) output.

The LO input is connected to a first inverter and the IF input is connected to a second inverter. The LO input and the first inverter output are connected respectively to the first and second CK inputs of a first T-type flip-flop. A "1" logic signal is connected to the T input of the first T-type flip-flop, and to the T input of a second T-type flip-flop. These first and second T-type flip-flops together produce the LO quadrature outputs. The IF input and the second inverter output are connected respectively to the first and second CK inputs of a third T-type flip-flop. A "1" logic signal is connected to the T input of the third T-type flip-flop, and to the T input of a fourth T-type flip-flop. These third and fourth T-type flip-flops together produce the IF quadrature outputs. A mixer-splitter circuit is connected to the four T-type flip-flops and produces an RF output signal.

The mixer-splitter circuit comprises a first mixer circuit connected to the first T-type flip-flop LO quadrature outputs and the third T-type flip-flop IF quadrature outputs, and produces a first RF output. A second mixer circuit connected to the second T-type flip-flop LO quadrature outputs and the fourth T-type flip-flop IF quadrature outputs produces a second RF output. A 2 way 0 degree splitter connected to the first and second RF outputs produces a mixer to RF output signal proportional to either the sum of the frequencies of the LO input and the IF input, or the difference of the frequencies of the LO input and the IF input.

The mixer circuits and 2 way 0 degree splitter together are composed of four FETs and a load resistor. In this configuration, a first LO 0 degree phase shifted signal is connected to the first FET gate terminal and a first IF 0 degree phase shifted signal is connected to the first FET drain terminal. A first LO 180 degree phase shifted signal is connected to the second FET gate terminal and a first IF 180 degree phase shifted signal is connected to the second FET drain terminal. A second LO 0 degree phase shifted signal is connected to the third FET gate terminal and a second IF 0 degree phase shifted signal is connected to the third FET drain terminal. A second LO 180 degree phase shifted signal is connected to the fourth FET gate terminal and a second IF 180 degree phase shifted signal is connected to the fourth FET drain terminal. The LO and IF signals respectively comprise the LO and IF quadrature outputs. All four FET source terminals are connected commonly and to a load resistor, across which the mixer RF output signal is present.

OBJECTS AND FEATURES OF THE INVENTION

It is an object of the present invention to provide an SSB mixer capable of operation from DC voltage up to a frequency of at least 100 MHz.

It is a feature of the present invention to use quadrature generators, frequency dividers and a 2 way/0 degree splitter to realize an SSB mixer.

It is another feature of the present invention that the SSB mixer is constructed of FETs, digital logic inverters and T-type flip-flop logic gates.

BRIEF DESCRIPTION OF THE DRAWINGS

The present version of the invention will be more fully understood with reference to the following Detailed Description in conjunction with the drawings of which:

FIG. 6 is a chart showing the output power spectrum of the SSB mixer and the conversion loss at 99.9 MHz.

DESCRIPTION OF THE PREFERRED EMBODIMENT AND BEST MODE

Figure 1:
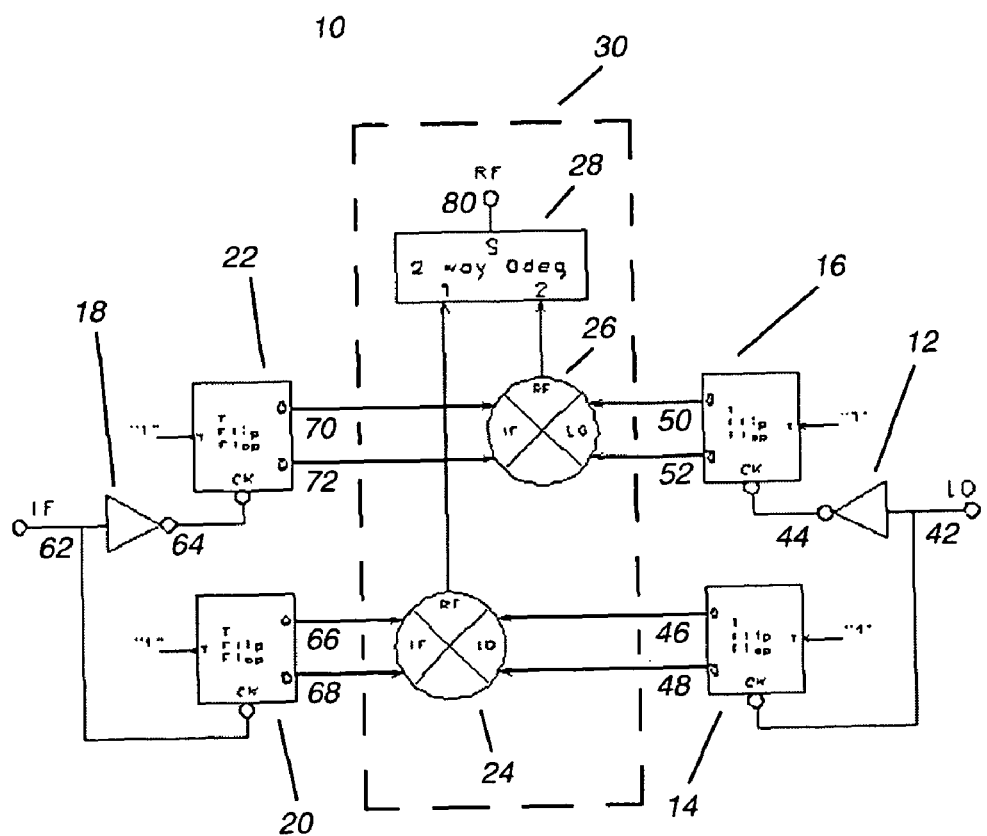
FIG. 1 is a block diagram of an SSB mixer incorporating T-type flip-flops therein.

The single side band mixer 10 circuit is shown in FIG. 1. There are two component groups each composed of an inverter and a pair of T flip-flops, wherein each component group functions as a quadrature generator to yield the output phase shifted by 0, 90, 180 and 270 degrees. This is performed for both the LO signal 42 and the IF signal 62. The LO signal 42 is fed into a first inverter 12, yielding an inverted LO signal 44. The LO signal 42 is also fed into the clock (CK) input of a first T flip-flop 14 yielding a 0 degree quadrature LO signal 46 and a 180 degree quadrature LO signal 48. (While the CK input is traditionally called a clock input, the use herein has no bearing on clock signals and the CK input is merely a useful input terminal.) The inverted LO signal 44 is fed into the CK input of a second T flip-flop 16 yielding a 90 degree quadrature LO signal 50 and a 270 degree quadrature LO signal 52. Likewise, the IF signal 62 is fed into a second inverter 18, yielding an inverted IF signal 64. The IF signal 62 is also fed into the CK input of a third T flip-flop 20 yielding a 0 degree quadrature IF signal 66 and a 180 degree quadrature IF signal 68. The inverted IF signal 64 is fed into the CK input of a fourth T flip-flop 22 yielding a 90 degree quadrature IF is signal 70 and a 270 degree quadrature IF signal 72. These IF quadrature signals are at half the frequency of the IF signal 62 and are fed along with the LO quadrature signals at half the frequency of the LO signal 42 into a mixer-splitter circuit 30 constructed of a first mixer 24, a second mixer 26 and a combiner realized by a 2-way/0 degree splitter 28. The RF output frequency is either $$\frac{f_{LO} + f_{IF}}{2} \text{ or } \frac{f_{LO} - f_{IF}}{2}$$

but it will not be both expressions at once.

Figure 2:
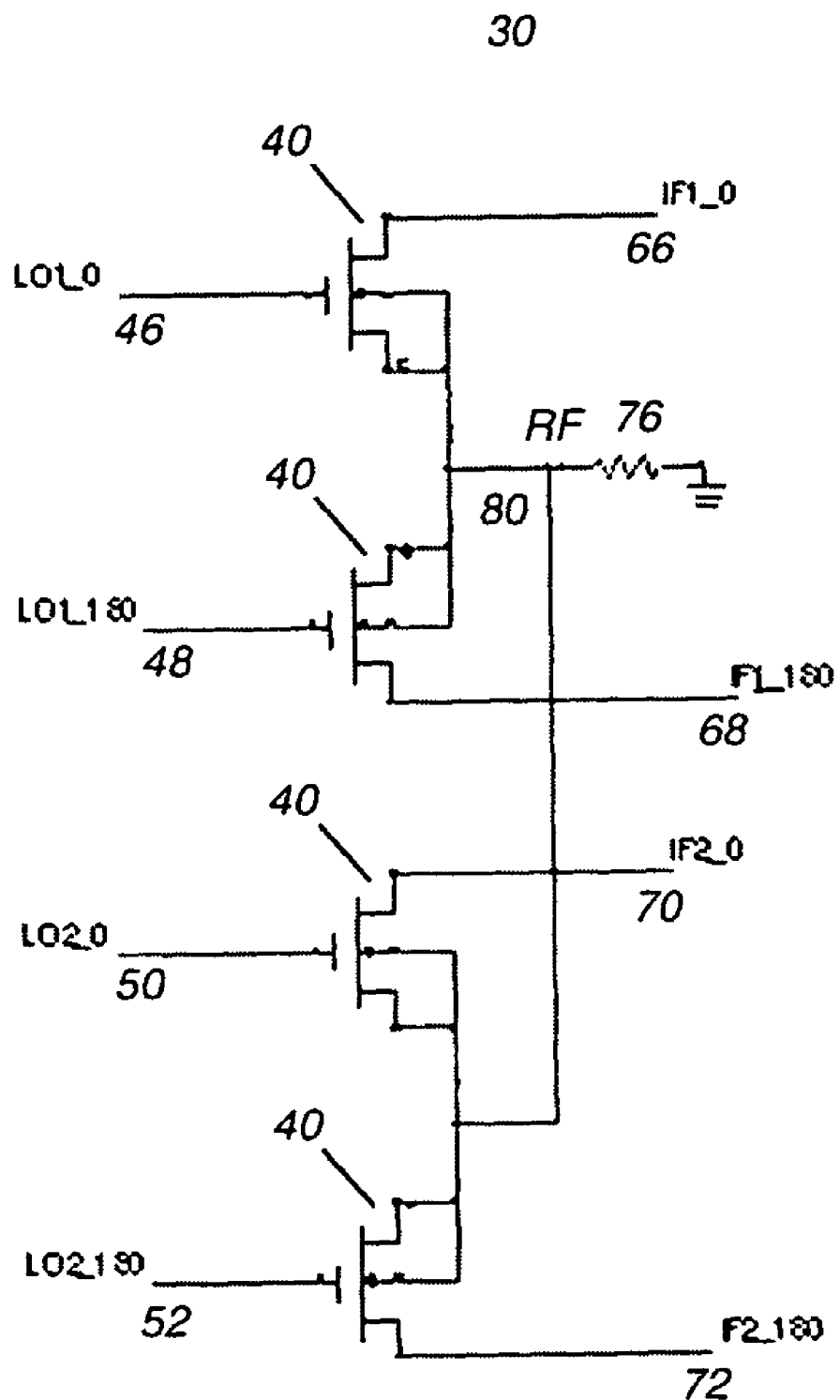
FIG. 2 is a circuit diagram showing the mixer and splitter elements of the SSB mixer of FIG. 1.

The mixer-splitter circuit 30 comprising a first mixer 24, a second mixer 26 and a combiner realized by a 2-way/0 degree splitter 28 is shown in a more essential component form in FIG. 2. The mixer and combiner functions are accomplished with four field effect transistors (FETs) 40 wherein the LO inputs are connected to the FET 40 gate terminals and the IF inputs are connected to the FET 40 drain terminals. (Note that the LO and IF inputs can be interchanged and the circuit will still function properly.) The FET 40 source terminals are connected together and to a load resistor 76 referenced to ground. The signal seen at the load resistor 76 is the RF signal 80.

This SSB mixer circuit has advantages over the prior art including the ability to function from DC up to the lower of the maximum frequencies of the inverter and T flip-flops. Typical prior art SSB mixer circuits are only useful over a very narrow frequency band due to the limited bandwidth of the internal 90 degree splitters employed. The typical lower frequency to upper frequency ratio in these prior art SSB mixer circuits is on the order of 1.1:5.

The maximum operating frequency for the single side band mixer is limited by the speed of the integrated circuit technology from which the inverters and T-type flip-flops are created. In this example, 100 MHz is an inherent limit of the CMOS integrated circuit technology from which this realization of the circuit was modeled and constructed, due to the frequency division occurring in the T-type flip-flops. If higher-speed circuit technologies are used to model and construct this device, the maximum operating frequency will increase.

Figure 3:
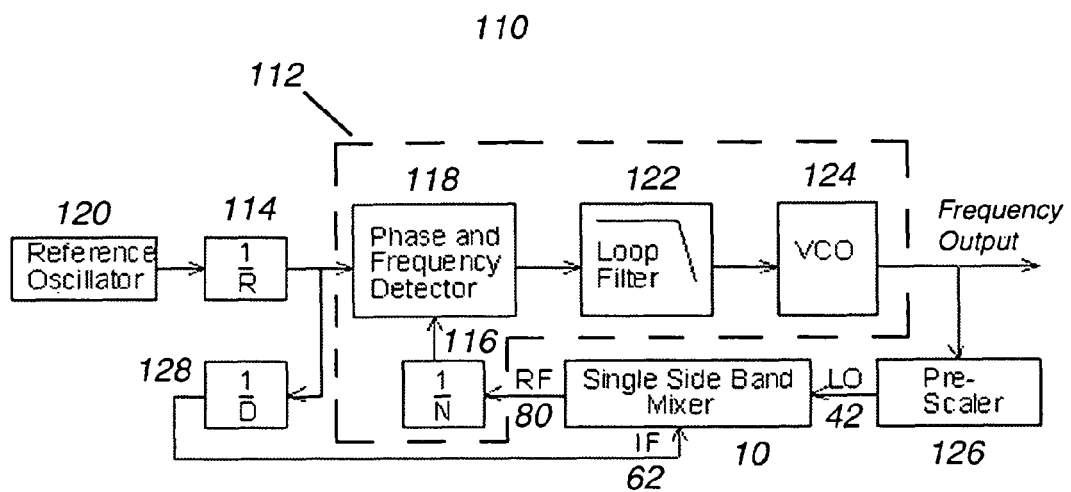
FIG. 3 is a block diagram of a frequency synthesizer showing the SSB mixer incorporated into the feedback loop of a phase locked loop circuit.

The SSB mixer brings significant advantages to frequency synthesizer circuits when used with a phase locked loop. FIG. 3 shows the SSB mixer incorporated into the feedback loop of a frequency synthesizer circuit. A frequency synthesizer 110 feeds the Frequency output signal from the VCO 124 into a pre-scaler 126 to produce the local oscillator (LO) signal 42. The pre-scaler is necessary if for example the PLL circuitry is composed of CMOS elements with a frequency limit in the range of hundreds of MHZ, and the PLL is operated at higher frequencies, including in the GHz range. A pre-scaler realized in a GaAs integrated circuit technology functions at these higher frequencies and converts the signal to a lower frequency range suitable for operation of the PLL. This is combined in the single side band mixer 10 with the intermediate frequency (IF) signal 62 output from an intermediate divider 128 that is fed by the output from the reference divider 114. The reference divider 114 receives input from the reference oscillator 120. This configuration requires the PLL 112 to have the reference divider output available as an external signal, if the PLL 112 is an IC incorporating the reference divider 114. The reference divider 114 also inputs signal to the phase and frequency detector 118 which is internal to the PLL 112 and which in turn inputs signal to the loop filter 122 which inputs signal to the VCO 124. The IF and LO signals input to the single side band mixer 10 produce an RF signal 80 which is input to the integer divider 116. Ideally, the input signals applied to the SSB mixer 10 have a duty cycle of 50%. Note that the intermediate divider 128 may also be referred to as a D counter. In an alternate configuration, a lowpass filter can be connected between the RF output 80 of the SSB mixer 10 and the input to the integer divider 116.

Figure 4:
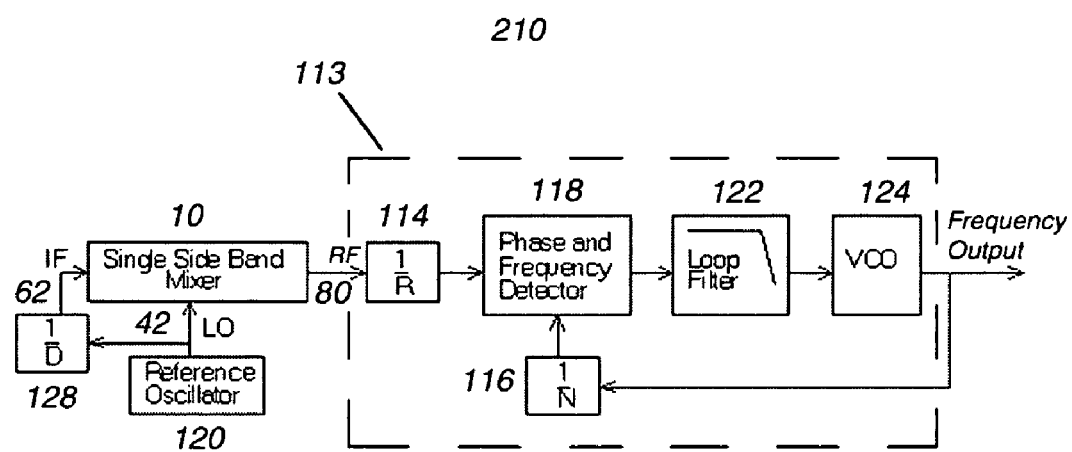
FIG. 4 is a block diagram of a frequency synthesizer showing an SSB mixer incorporated into an input loop producing an RF signal output for input to a phase locked loop circuit.

One disadvantage of this circuit topology is that if it is used with a PLL integrated circuit incorporating a reference divider, there must be a reference divider output. The frequency synthesizer as shown in FIG. 4 is more suitable for use with PLL ICs incorporating a reference divider 114 and either having or lacking a reference divider output. Additionally, the preferred embodiment does not require a pre-scaler. The reference divider-included PLL 113 is shown in the frequency synthesizer 210 of FIG. 4. In this circuit topology, the modulation is performed on the reference input to the reference divider 114. The reference oscillator 120 outputs the LO signal 42 to the single side band mixer 10 and the intermediate divider 128. The intermediate divider 128 output is the IF signal 62 which is input to the SSB mixer 10, there combined with the LO signal 42 to output the RF signal 80 that is input to the PLL 112. Alternatively for either frequency synthesizer design, the IF signal 62 can be applied to the SSB mixer 10 from an external source by the user, and not be limited by the intermediate divider 128. As with the circuit topology incorporating the SSB mixer into the feedback loop of the PLL, the IF is the frequency resolution of the frequency synthesizer.

The SSB mixer can also function as a quadrature demodulator, which recovers both the in-phase and 90° components of the input signal. In many modulation schemes, the carrier signal may contain both in-phase and 90° quadrature phase components at the carrier frequency. When the input signal is demodulated by both an in-phase and a quadrature shifted local oscillator, then the baseband output signals I and Q can be measured to determine the amount of in-phase and quadrature energy in the input signal. To use the SSB mixer as a quadrature demodulator, the second inverter 18, third T-type flip-flop 20 and fourth T-type flip-flop 22 are removed and the inputs become the LO signal 42 and the RF signal 80. The differential I and Q outputs are seen at 66, 68, 70 and 72. The advantages of using the SSB mixer for this purpose are high linearity expressed as high IP3 and high 1 dB compression, and low susceptibility to LO power.

Figure 5A:
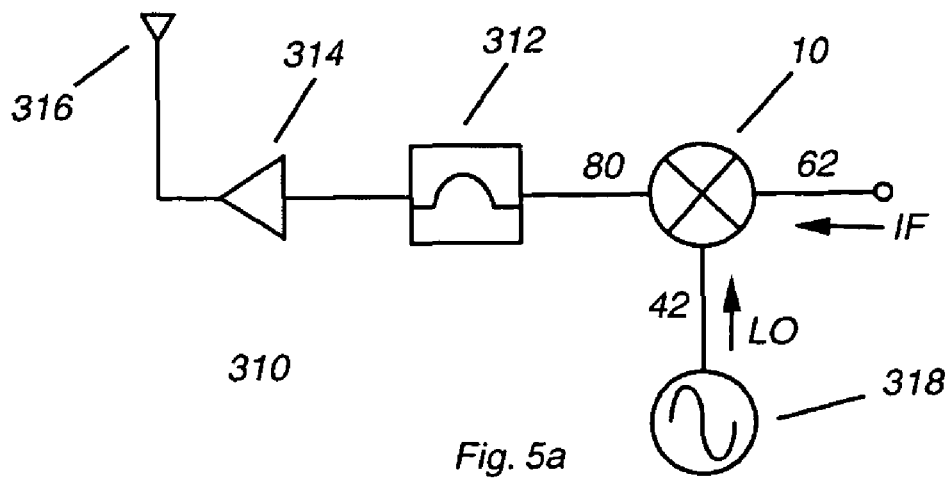
FIG. 5*a* is a circuit diagram of the SSB mixer used as an up-converter circuit.
Figure 5B:
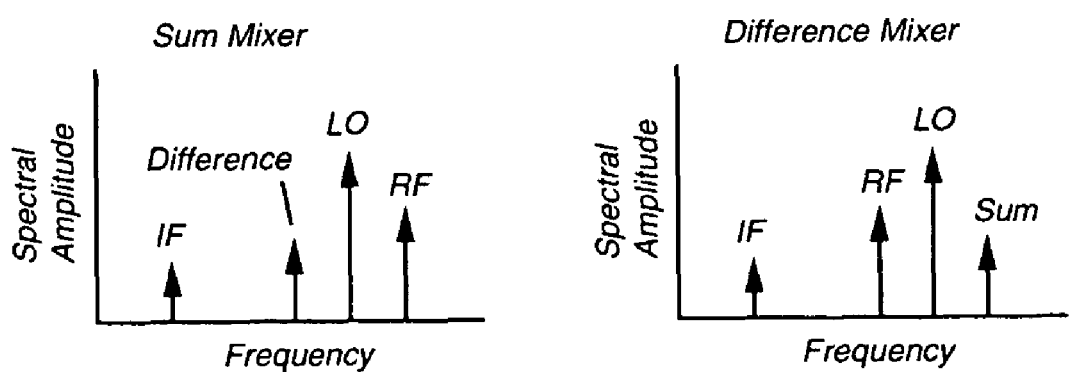
FIG. 5*b* shows the output functions for the up-converter circuit of FIG. 5*a*.

FIG. 5a shows the SSB mixer 10 used for up-conversion, where the limiting factor for maximum frequency performance is the frequency bandwidth of the internal T-type Flip-Flops, thus providing a significantly wider operating bandwidth than was possible with prior art devices. In the up-converter 310 the IF port 62 input and the local oscillator signal 318 feeding the LO port 42 input are mixed to yield an output signal at the RF port 80 which is filtered by an RF filter 312 to remove undesirable lower frequency signals, amplified by the RF amplifier 314 and sent to the antenna 316. For sum mixing, $f_{RF}=f_{LO}+f_{IF}$ and for difference mixing $f_{RF}=f_{LO}-f_{IF}$. FIG. 5b shows the spectral amplitude response for the up-converter for both sum mixing and difference mixing.

Prototyping and testing a circuit meant to be realized as a high-frequency integrated circuit out of discrete devices is an expensive and time-consuming task, and the physical realization has sources of error including mismatch between the discrete devices, mismatch between path lengths at higher frequencies and inaccurate frequency response due to disparities in actual versus intended device sizes. For many high-frequency circuit development applications, a more cost-effective and potentially more accurate way to evaluate circuit performance is the use of advanced computer models to simulate circuit performance.

An example of a high-frequency circuit modeling system is the Agilent Advanced Design System (ADS) which was created to assist with electronic design automation. Software of this type assists in the design of electronic circuitry intended to be incorporated in devices such as cellular and portable phones, pagers, wireless networks, and radar and satellite communications systems. In such a circuit modeling system, there are groups of equations for each type of circuit element. The user selects and connects the desired circuit elements, to which signal inputs are then applied and circuit response measured at selected nodes. The value and general methods of use of these modeling tools is well understood by persons of ordinary skill in the art.

FIG. 6 shows an ADS computer simulation of the spectrum of the output power of the SSB mixer 10. The output is shown in dBm, or dB referenced to 1 milliwatt. The four LO input frequencies are set to 100 MHz with a power of 17 dBm each and the four IF input frequencies are set to 0.1 MHz with a power of −10 dBm each. The LO and IF inputs are shown clearly in FIG. 1 and FIG. 2. The sum of the four IF inputs feeding into the SSB mixer 10 yield a total of −4 dBm. The desired RF out signal is 99.9 MHz, having a power of −11.554 dBm.

The ADS output display shown in FIG. 6 allows the user to select a given frequency for which to calculate conversion loss. The conversion loss (ConvLoss) is a measure of the efficiency of the mixer in providing translation between the input IF signals and the output RF signal, or IF power−RF power. In this case the ConvLoss at 99.9 MHz is −7.554 dB.

An alternate embodiment of the invention has the SSB mixer 10 comprising an integrated circuit.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A single side band mixer comprising:
 a first quadrature generator, a second quadrature generator, and a mixer-splitter circuit;
 said first quadrature generator having an LO input and producing LO quadrature outputs;
  said LO quadrature outputs being a first LO 0 degree phase shifted signal, a second LO 0 degree phase shifted signal, a first LO 180 degree phase shifted signal, and a second LO 180 degree phase shifted signal;
 said second quadrature generator having an IF input and producing IF quadrature outputs;
  said IF quadrature outputs being a first IF 0 degree phase shifted signal, a second IF 0 degree phase shifted signal, a first IF 180 degree phase shifted signal, and a second IF 180 degree phase shifted signal;
 said mixer-splitter circuit further comprising;
 a first FET with a first FET gate terminal, a first FET drain terminal and a first FET source terminal;
 said first LO 0 degree phase shifted signal connected to said first FET gate terminal and said first IF 0 degree phase shifted signal connected to said first FET drain terminal;
 a second FET with a second FET gate terminal, a second FET drain terminal and a second FET source terminal;
 said first LO 180 degree phase shifted signal connected to said second FET gate terminal and said first IF 180 degree phase shifted signal connected to a second FET drain terminal;
 a third FET with a third FET gate terminal, a third FET drain terminal and a third FET source terminal;
 a second LO 0 degree phase shifted signal connected to said third FET gate terminal and a second IF 0 degree phase shifted signal connected to said third FET drain terminal;
 a fourth FET with a fourth FET gate terminal, a fourth FET drain terminal and a fourth FET source terminal;
 said second LO 180 degree phase shifted signal connected to said fourth FET gate terminal and said second IF 180 degree phase shifted signal connected to said FET drain terminal; and,
 said first, second, third and fourth FET source terminals are connected commonly and to a load resistor, whereby said mixer RF output signal is present as a voltage across said load resistor.

2. A single side band mixer as described in claim 1, wherein:
 said first quadrature generator further comprises;
  a first inverter with an LO input and a first inverter output;
  a second inverter with an IF input and a second inverter output;

a first T-type flip-flop having a first clock (CK) input, and a second T-type flip-flop having a second CK input, said LO input and said first inverter output connected respectively to said first and second CK inputs;

a "1" logic signal connected respectively to said first T-type flip-flop T input and to said second T-type flip-flop T input;

said first and second T-type flip-flop in combination producing said LO quadrature outputs;

said second quadrature generator further comprises;

a third T-type flip-flop having a third CK input, and a fourth T-type flip-flop having a fourth CK input, said IF input and said second inverter output connected respectively to said third and fourth CK inputs;

said "1" logic signal connected respectively to said third T-type flip-flop T input and to said fourth T-type flip-flop T input; and, said third and fourth T-type flip-flop in combination producing said IF quadrature outputs.

3. A single side band mixer as described in claim 1, wherein said mixer-splitter circuit further comprises;

a first mixer circuit connected to said first T-type flip-flop LO quadrature outputs and said third T-type flip-flop IF quadrature outputs, producing a first RF output;

a second mixer circuit connected to said second T-type flip-flop LO quadrature outputs and said fourth T-type flip-flop IF quadrature outputs, producing a second RF output; and, a 2 way 0 degree splitter connected to said first RF output and said second RF output and producing a mixer RF output signal proportional to a signal from the group consisting of the sum of the frequencies of said IF input and said LO input, and the difference of the frequencies of said IF input and said LO input.

4. A single side band mixer as described in claim 1, wherein said mixer is incorporated into an integrated circuit.

5. A single side band mixer as described in claim 1, wherein said mixer is a portion of a frequency synthesizer circuit comprising;

a phase-locked loop (PLL) with a feedback loop and a frequency output;

said PLL having a phase and frequency detector, said phase and frequency detector with a reference divider input path and an integer divider input path;

said integer divider input path being in said feedback loop of said PLL;

a reference oscillator connected to said reference divider input path;

said single side band (SSB) mixer having an intermediate frequency (IF) input and a local oscillator (LO) input and producing a radio frequency (RF) output signal; and, said RF output signal forming at least a portion of a signal path selected from the group consisting of said reference divider input path and said integer divider input path.

6. A single side band mixer as described in claim 5, wherein said mixer is a portion of a frequency synthesizer circuit further comprising;

said PLL having a reference divider in said reference divider input path, said reference divider providing input to said phase and frequency detector, said reference divider having said RF output signal as an input;

an intermediate divider connected to said reference divider input path;

said reference oscillator providing said LO input to said SSB mixer and to said intermediate divider; and, said intermediate divider providing said IF input to said SSB mixer.

7. A single side band mixer as described in claim 6, wherein a pre-scaler is connected to said frequency output and provides said LO input to said SSB mixer.

8. A single side band mixer as described in claim 6, wherein a low pass filter is inserted in the signal path between said SSB mixer and said integer divider.

9. A single side band mixer as described in claim 6, wherein said IF input is externally generated and input to said SSB mixer.

10. A single side band mixer as described in claim 5, wherein said mixer is a portion of a frequency synthesizer circuit further comprising;

a reference divider in said reference divider input path, said reference divider connected to said reference oscillator and providing input to said phase and frequency detector;

an intermediate divider connected to said reference divider input path, said intermediate divider providing said IF input to said SSB mixer;

said frequency output providing said LO input to said SSB mixer; and, said RF output signal and said LO input comprising a portion of said integer divider input path.

11. A frequency synthesizer as described in claim 10, wherein said IF output is externally generated and input to said SSB mixer.

12. A single side band mixer as described in claim 1, wherein said mixer is a portion of an up-converter circuit comprising;

said mixer having said LO and IF inputs and said RF output;

an RF filter having signal input from said RF output; and, an RF power amplifier having signal input from said RF filter and providing an amplified output.

13. A single side band mixer as described in claim 2, wherein said mixer is a quadrature demodulator wherein;

said second inverter, said third T-type flip-flop and said fourth T-type flip-flop are removed from the mixer;

said voltage across said load resistor is an RF input signal; and, said first, second, third and fourth FET gate terminals are differential I and Q outputs.

14. A single side band mixer comprising;

a first inverter with an LO input and a first inverter output;

a second inverter with an IF input and a second inverter output;

a first T-type flip-flop having a first clock (CK) input, and a second T-type flip-flop having a second CK input, said LO input and said first inverter output connected respectively to said first and second CK inputs;

a "1" logic signal connected respectively to said first T-type flip-flop T input and to said second T-type flip-flop T input;

said first and second T-type flip-flop in combination producing LO quadrature outputs;

a third T-type flip-flop having a third CK input, and a fourth T-type flip-flop having a fourth CK input, said IF input and said second inverter output connected respectively to said third and fourth CK inputs;

said "1" logic signal connected respectively to said third T-type flip-flop T input and to said fourth T-type flip-flop T input; and, said third and fourth T-type flip-flop in combination producing IF quadrature outputs;

a mixer-splitter circuit interconnected to said first, second, third and fourth T-type flip-flops, said mixer-splitter circuit, in turn, comprising;

a first mixer circuit connected to said first T-type flip-flop LO quadrature outputs and said third T-type flip-flop IF quadrature outputs, producing a first RF output;

a second mixer circuit connected to said second T-type flip-flop LO quadrature outputs and said fourth T-type flip-flop IF quadrature outputs, producing a second RF output;

a 2 way 0 degree splitter connected to said first RF output and said second RF output and producing a mixer RF output signal proportional to a signal from the group consisting of the sum of the frequencies of said IF input and said LO input, and the difference of the frequencies of said IF input and said LO input;

said mixer-splitter circuit further comprising;

a first FET with a first FET gate terminal, a first FET drain terminal and a first FET source terminal;

a first LO 0 degree phase shifted signal connected to said first FET gate terminal and a first IF 0 degree phase shifted signal connected to said first FET drain terminal;

a second FET with a second FET gate terminal, a second FET drain terminal and a second FET source terminal;

a first LO 180 degree phase shifted signal connected to said second FET gate terminal and a first IF 180 degree phase shifted signal connected to a second FET drain terminal;

a third FET with a third FET gate terminal, a third FET drain terminal and a third FET source terminal;

a second LO 0 degree phase shifted signal connected to said third FET gate terminal and a second IF 0 degree phase shifted signal connected to said third FET drain terminal;

a fourth FET with a fourth FET gate terminal, a fourth FET drain terminal and a fourth FET source terminal;

a second LO 180 degree phase shifted signal connected to said fourth FET gate terminal and a second IF 180 degree phase shifted signal connected to said fourth FET drain terminal;

wherein said LO and IF signals comprise respectively said LO and IF quadrature outputs; and, said first, second, third and fourth FET source terminals are connected commonly and to a load resistor, whereby said mixer RF output signal is present as a voltage across said load resistor.

* * * * *